United States Patent
Yamazaki et al.

(10) Patent No.: US 8,343,239 B2
(45) Date of Patent: Jan. 1, 2013

(54) GROUP III NITRIDE SEMICONDUCTOR MANUFACTURING SYSTEM

(75) Inventors: Shiro Yamazaki, Aichi-ken (JP); Koji Hirata, Aichi-ken (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 1105 days.

(21) Appl. No.: 12/289,257

(22) Filed: Oct. 23, 2008

(65) Prior Publication Data
US 2009/0106959 A1  Apr. 30, 2009

(30) Foreign Application Priority Data
Oct. 26, 2007  (JP) ................ P2007-278935

(51) Int. Cl.
*H01L 21/02* (2006.01)
*C30B 9/00* (2006.01)
*C30B 35/00* (2006.01)

(52) U.S. Cl. .............. 29/25.01; 117/73; 117/200
(58) Field of Classification Search .......... None
See application file for complete search history.

(56) References Cited

U.S. PATENT DOCUMENTS

| | | | | |
|---|---|---|---|---|
| 4,790,986 | A * | 12/1988 | Kim et al. | 423/659 |
| 7,378,062 | B2 * | 5/2008 | Itatani et al. | 422/186.04 |
| 2001/0004874 | A1 * | 6/2001 | Igarashi et al. | 117/11 |
| 2005/0098090 | A1 * | 5/2005 | Hirota et al. | 117/2 |
| 2007/0034143 | A1 * | 2/2007 | Sarayama et al. | 117/89 |
| 2007/0084399 | A1 * | 4/2007 | Sarayama et al. | 117/73 |
| 2007/0215033 | A1 | 9/2007 | Imaeda et al. | |
| 2008/0223288 | A1 * | 9/2008 | Yamazaki et al. | 117/200 |
| 2009/0120354 | A1 * | 5/2009 | Sarayama et al. | 117/203 |
| 2009/0126623 | A1 * | 5/2009 | Yamazaki | 117/77 |
| 2010/0139551 | A1 * | 6/2010 | Arita et al. | 117/64 |

(Continued)

FOREIGN PATENT DOCUMENTS

CN  1528948 (A)  9/2004

(Continued)

OTHER PUBLICATIONS

DEWENT-ACC-No: 2011-N01730 which corresponds to JP-2011-207676A (published 2011).*

(Continued)

*Primary Examiner* — Kiley Stoner
(74) *Attorney, Agent, or Firm* — McGinn IP Law Group, PLLC

(57) ABSTRACT

The invention provides a group III nitride semiconductor manufacturing system which is free from interruption to rotation of a rotational shaft. The group III nitride semiconductor manufacturing system has a reacting vessel having an opening, a crucible disposed in an interior of the reaction vessel and containing a melt including at least a group III metal and an alkali metal, a holding unit supporting the crucible and having a rotational shaft extending from the interior of the reaction vessel to an exterior of the reaction vessel through the opening, a rotational shaft cover covering a part of the rotational shaft positioned at the exterior of the reacting vessel and connected to the reacting vessel at the opening, a rotational driving unit disposed at an outside of the reacting vessel and regulating the rotational shaft and a supply pipe connected to the rotational shaft cover and supplying a gas including at least nitrogen into a gap between the rotational shaft and the rotational shaft cover, wherein the gas and the melt react to grow a group III nitride semiconductor crystal.

20 Claims, 3 Drawing Sheets

U.S. PATENT DOCUMENTS

| | | | |
|---|---|---|---|
| 2010/0192839 A1* | 8/2010 | Hatakeyama et al. | 117/77 |
| 2011/0011333 A1 | 1/2011 | Imaeda et al. | |
| 2012/0085279 A1* | 4/2012 | Sarayama et al. | 117/223 |

FOREIGN PATENT DOCUMENTS

| | | | |
|---|---|---|---|
| JP | 2005-187317 (A) | | 7/2005 |
| JP | 2007-092095 A | * | 4/2007 |
| JP | 2007-254161 (A) | | 10/2007 |
| JP | 2011-173771 A | * | 9/2011 |
| JP | 2011-173772 A | * | 9/2011 |
| JP | 2011-184234 A | * | 9/2011 |

OTHER PUBLICATIONS

Chinese Office Action dated Jun. 24, 2011, with English translation.

* cited by examiner ns of the invention will be described by reference to the drawings, but the invention is not limited to the embodiments.

GROUP III NITRIDE SEMICONDUCTOR MANUFACTURING SYSTEM

BACKGROUND OF THE INVENTION

The present invention relates to a group III nitride semiconductor manufacturing system and more particularly to a group III nitride semiconductor manufacturing system based on a fluxing method using an alkali metal.

There has conventionally been known a group III nitride semiconductor crystal growing method based on an Na (sodium) fluxing method. This method is a crystal growth of GaN (Gallium Nitride) on a surface of a seed crystal. The process is reaction under several tenth of atmospheric pressure between nitrogen and melted Na and Ga kept around 800° C.

In the crystal growing method based on the Na fluxing method, in order to increase crystal uniformity and crystal growth stability, such an approach as rotating a crucible or rotating a seed crystal is adopted (refer to JP-A-2005-187317 and JP-A-2007-254161). In order to realize the rotation of the crucible or seed crystal, a rotational shaft is provided on the manufacturing system which holds the crucible or the seed crystal.

In this method, however, there are problems caused by the fact that Na evaporated during crystal growth enters a gap between the reaction vessel and the rotational shaft. The first example problem is interruption of rotation of the rotational shaft liquefied or solidified Na. Another one is the rotational shaft cannot be moved up and down vertically. This deficiency makes it difficult for the crucible or crystal to be taken out of the reaction vessel. In particular, in the case of Na being solidified, the rotational shaft has to be heated to melt the solidified Na.

SUMMARY OF THE INVENTION

The invention has been made in view of the situations and an object thereof is to provide a group III nitride semiconductor manufacturing system which is free from interruption to rotation and movement of a rotational shaft.

With a view to attaining the object, according to a first aspect of the invention, a group III nitride semiconductor manufacturing system including a reacting vessel having an opening, a crucible disposed in an interior of the reaction vessel and containing a melt including at least a group III metal and an alkali metal, a holding unit supporting the crucible and having a rotational shaft extending from the interior of the reaction vessel to an exterior of the reaction vessel through the opening, a rotational shaft cover covering a part of the rotational shaft positioned at the exterior of the reacting vessel and connected to the reacting vessel at the opening, a rotational driving unit disposed at an outside of the reacting vessel and regulating the rotational shaft and a supply pipe connected to the rotational shaft cover and supplying a gas including at least nitrogen into a gap between the rotational shaft and the rotational shaft cover, wherein the gas and the melt react to grow a group III nitride semiconductor crystal.

According to a second aspect of the invention, there is provided a group III nitride semiconductor manufacturing system including a reacting vessel having an opening, a crucible disposed in an interior of the reaction vessel and containing a melt including at least a group III metal and an alkali metal, a holding unit holding a seed crystal and having a rotational shaft extending from the interior of the reaction vessel to an exterior of the reaction vessel through the opening, a rotational shaft cover covering a part of the rotational shaft positioned at the exterior of the reacting vessel and connected to the reacting vessel at the opening, a rotational driving unit disposed at an outside of the reacting vessel and regulating the rotational shaft and a supply pipe connected to the rotational shaft cover and supplying a gas including at least nitrogen into a gap between the rotational shaft and the rotational shaft cover, wherein the gas, the seed crystal and the melt react to grow a group III nitride semiconductor crystal.

In the first and second aspects of the invention, although Na is normally used as alkali metal, K (potassium) can be used. In addition, alkaline-earth metals such as Mg (magnesium) and Ca (calcium), or Li (lithium) may be mixed therewith. In addition, the gas containing nitrogen means a single or mixed gas which contains nitrogen molecules or nitrogen compound gas and may include inactive gas such as rare gas.

In addition, a single or a plurality of supply pipes which connect to the reaction vessel may be provided in addition to the supply pipe which connects to the rotational shaft cover.

According to a third aspect of the invention set froth in the first or second aspect of the invention, the rotational shaft has a first magnet and the rotational driving unit has a second magnet so as to rotate and move the rotational shaft by magnetic coupling between the first and the second magnet.

According to the first and second aspects of the invention, the gas containing at least nitrogen continues to flow into the gap between the rotational shaft and the rotational shaft cover during crystal growth so that evaporated Na can be prevented from entering the gap. Therefore the rotation and movement of the rotational shaft is not interrupted. As a result, crystal uniformity is increased, thereby making it possible to manufacture a high-quality group III nitride semiconductor. In addition, since the movement of the rotational shaft is not interrupted after the crystal growth, the removal of the crucible or group III nitride semiconductor crystal can be facilitated.

In addition, according to the third aspect of the invention, the configuration of the rotational driving unit is simple, and the rotational shaft can be controlled in such a state that communication between the interior and exterior of the reaction vessel is cut off by the rotational shaft cover.

The fourth aspect of the invention set forth in the second and first aspect, the reaction vessel has a dual structure including an inner vessel and an outer vessel. Preferably, a heater is mounted on an inside of the outer vessel and an outside of the inner vessel. Preferably, the outer vessel has an opening. Preferably, the opening is shared by the outer vessel and the inner vessel. Preferably, the inside of the outer vessel is pressured by gas including nitrogen.

According to the fourth aspect of the invention, as the outer vessel 31 is responsible for the pressure and the inner vessel 32 is heated by the heater inside of the reaction vessel 30, the efficient crystal growth is performed.

DETAILED DESCRIPTION OF PREFERRED EMBODIMENTS

Hereinafter, specific embodiments of the invention will be described by reference to the drawings, but the invention is not limited to the embodiments.

Figure 1:
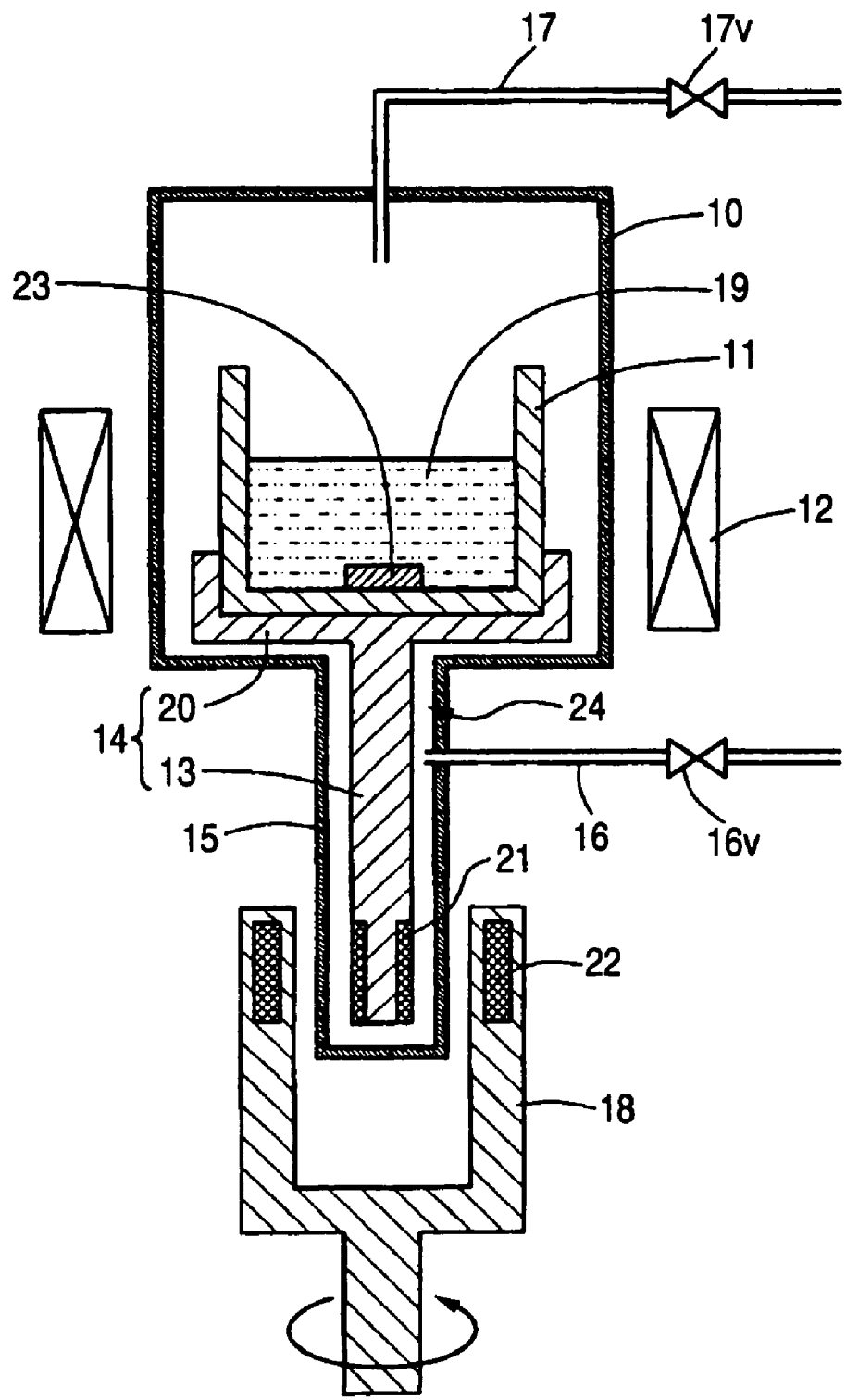
FIG. 1 shows the configuration of a group III nitride semiconductor manufacturing system of Embodiment 1.

FIG. 1 is a diagram showing the configuration of a group III nitride semiconductor manufacturing system of Embodiment 1. As is shown in FIG. 1, the group III nitride semiconductor manufacturing system is made up of following components. A reaction vessel 10 and a rotation shaft cover 15 are connected through an opening each other. The reaction vessel 10 is heated by a heater 12. In the reaction vessel 10, a crucible 11 containing a mixed melt 19 of Ga and Na is disposed. The crucible 11 is supported by a holding unit 14 which is provided with a rotational shaft 13. The rotational shaft cover 15 covers the part of the rotational shaft 13 exposed to the exterior of the reaction vessel 10 through the opening. A supply pipe for supplying nitrogen gas is connected to the rotational shaft cover 15. An exhaust pipe 17 for expelling gasses from the reaction vessel 10 is connected to the reaction vessel 10.

The reaction vessel 10 is made of stainless steel and has pressure resistance and heat resistance. The crucible 11 which is held by the holding unit 14 is disposed in the interior of the reaction vessel 10.

The crucible 11 is made from BN (boron nitride) and is disposed on a tray 20 in the interior of the reaction vessel 10. The mixed melt 19 of Ga and Na and a seed crystal 23 are held in an interior of the crucible 11.

The heater 12 is disposed to lie round external side and bottom portions of the reaction vessel 10. The temperature in the interior of the reaction vessel 10 is controlled by the heater 12.

The holding unit 14 is made up of the tray 20 on which the crucible 11 is disposed and the rotational shaft 13 which connects to the tray 20 and penetrates the reaction vessel 10 from an internal lower portion to an outside of the reaction vessel 10. At a distal end of the rotational shaft 13 of exterior side, a magnet 21 is provided.

The rotational shaft cover 15 covers an exterior the rotational shaft 13 in the reaction vessel 10 and connects to the reaction vessel 10 in such a manner as to be made to open thereto. The interior and exterior of the reaction vessel 10 are separated by the rotational shaft cover 15, forming a continuous space defined by a gap 24 between the rotational shaft 13 and the rotational shaft cover 15 and the interior of the reaction vessel 10.

The rotational driving unit 18 has a magnet 22 provided on a external side portion of the rotational shaft cover 15. The rotational shaft 13 can be rotated via the magnet 21 by rotating the magnet 22. In addition, the magnet 22 can be moved up and down in vertical direction. By this vertical motion, the rotational shaft 13 can also be moved up and down in the vertical direction. By the use of the magnets described above, the rotation and movement of the rotational shaft 13 can be controlled under the condition that the interior and the exterior of the reaction vessel 10 is sealed by the rotational shaft cover 15.

The supply pipe 16 connects to the rotational shaft cover 15 with a valve 16v. Nitrogen gas is supplied from the supply pipe 16 into the interior of the reaction vessel 10 through the gap 24 between the rotational shaft 13 and the rotational shaft cover 15.

The discharge pipe 17 connects to the reaction vessel 10 with a valve 17v. The valve 17v controls the amount of gases that are discharged to the outside of the reaction vessel 10 through the discharge pipe 17. By controlling the amounts of nitrogen gas supplied and discharge by the valves 16v, 17v of the supply pipe 16 and the discharge pipe 17, an internal pressure of the reaction vessel 10 is controlled.

Next, manufacturing of a GaN crystal using the group III nitride semiconductor manufacturing system of Embodiment 1 is described.

Firstly, the rotational shaft 13 is moved vertically upwards by the rotational driving unit 18 so that the tray 20 moves upside of the reaction vessel 10. In this state, a seed crystal 23, Ga, Na are placed in the interior of the crucible 11, and the crucible 11 is disposed on the tray 20. After that the rotational shaft 13 is moved vertically downwards by the rotational driving unit 18 so as to move the crucible 11 into the interior of the reaction vessel 10. Then a lid is mounted on the reaction vessel 10.

Next, the valve 16v is closed, and the valve 17v is opened, so that gases in the atmosphere of the reaction vessel 10 are exhausted. Thereafter, the valve 16v is opened so as to supply nitrogen into the interior of reaction vessel 10 through the gap 24 between the rotational shaft 13 and the rotational shaft cover 15. In addition, the valves 16v, 17v are controlled so that the internal pressure of the reaction vessel 10 becomes 50 atm.

Next, the interior of the reaction vessel 10 is heated by the heater 12. For crystal growth of GaN on the seed crystal, the condition in the interior of the reaction vessel 10 is kept 50 atm and 800° C. In addition, by the rotational shaft 13 being rotated by the rotational driving unit 18, the crucible 11 placed on the tray 20 is caused to rotate so as to stir the mixed melt 19. During this process, nitrogen gas is supplied from the supply pipe 16 to the interior of the reaction vessel 10 at all times.

Since nitrogen continues to flow towards the interior of the reaction vessel 10 through the gap between the rotational shaft 13 and the rotational shaft cover 15 at all times during growth of GaN crystal, no evaporated Na enters the gap. Consequently, a smooth rotation of the crucible 11 is implemented and the mixed melt 19 is stirred well by the rotating crucible. As a result the uniform composition of the mixed melt 19 and uniform growth of GaN crystal are attained.

Thereafter, the temperature of the reaction vessel is decreased down to the ordinary room temperature, ending the manufacturing of GaN crystal. Then, the lid of the reaction vessel 10 is opened, and the rotational shaft 13 is moved vertically upwards by the rotational driving unit 18 so as to draw the crucible 11 and the grown GaN crystal is drawn out. At this stage, as described above, since no evaporated Na enters the gap defined between the rotational shaft 13 and the rotational shaft cover 15, the upward movement of the rotational shaft 13 is implemented in a smooth fashion, and the crucible 11 can easily be removed from the reaction vessel 10.

As described heretofore, in the group III nitride semiconductor manufacturing system of Embodiment 1, evaporated Na is prevented from entering the gap defined between the rotational shaft 13 and the rotational shaft cover 15 during the growth of GaN crystal. Consequently, the rotation of the crucible 11 is not interrupted. This advantage makes the composition of the mixed melt 19 to be uniform. As a result, crystal uniformity is increased, and a high quality group III nitride semiconductor is manufactured. In addition, the crucible 11 can easily be removed after the completion of crystal growth. This means that operating efficiency of this invention is improved.

Figure 2:
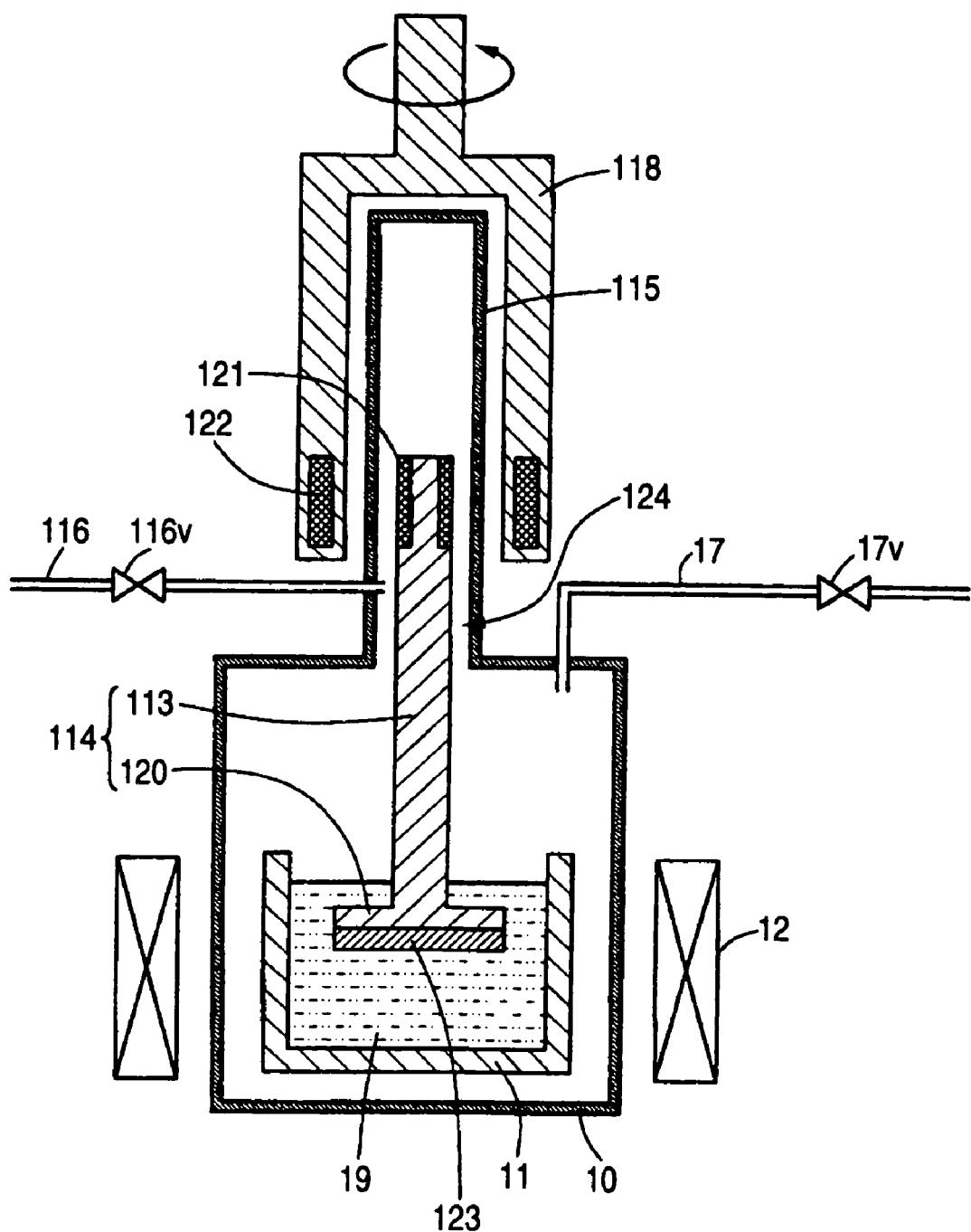
FIG. 2 shows the configuration of a group III nitride semiconductor manufacturing system of Embodiment 2.

FIG. 2 shows the configuration of a group III nitride semiconductor manufacturing system of Embodiment 2. In the group III nitride semiconductor manufacturing system of Embodiment 2, a holding unit 114 is substituted for the holding unit 14 which holds the crucible 11 in the above mentioned Embodiment 1. The holding unit 114 is used to hold a seed crystal 123.

The holding unit 114 is made up of a rotational shaft 113 and a fixing part 20 on which the seed crystal 123 is fixed. The rotational shaft 113 penetrates a reaction vessel 10 from an internal upper portion to an outside through a opening. A magnet 121 is provided at a distal end of the rotational shaft 113 which lies outside the reaction vessel 10. In addition, a rotational shaft cover 115 is connected to the upper end of the reaction vessel at the opening. The rotational shaft cover 115 covers an exterior of the rotational shaft 113 in the reaction vessel 10 and connects to the reaction vessel 10 in such a manner as to be made to open thereto. The interior and exterior of the reaction vessel 10 are separated by the rotational shaft cover 15, forming a continuous space defined by a gap 124 between the rotational shaft 113 and the rotational shaft cover 115 and the interior of the reaction vessel 10. A supply pipe 116 connects to the rotational shaft cover 115. The supply pipe 116 has a valve 116v along the length thereof.

A rotational driving unit 118 is provided above the reaction vessel 10 for controlling the rotation and movement of the rotational shaft 113. The rotational driving unit 118 has a magnet 122. The rotational shaft 113 rotates via the magnet 121 by rotating the magnet 122. In addition, as the magnet 122 moves vertically upwards and downwards, the rotational shaft 113 also moves vertically upwards and downwards.

Other configurations of the group III nitride semiconductor manufacturing system of Embodiment 2 than the constituent elements or portions that are described above are similar to corresponding elements described in the group III nitride semiconductor manufacturing system of Embodiment 1.

Next, manufacturing of a GaN crystal using the group III nitride semiconductor manufacturing system of Embodiment 2 is described.

Firstly, the rotational shaft 113 is moved vertically upwards by the rotational driving unit 118 so that the holding unit 114 moves upwards. In this state, Ga and Na are placed in the interior of the crucible 11, and the crucible 11 is disposed in the interior of the reaction vessel 10. In addition, a seed crystal 123 is fixed to the fixing part 120 of the holding unit 114, and then the reaction vessel 10 is closed.

Next, the valve 16v is closed, and the valve 17v is opened, so that gases in the reaction vessel 10 are discharged. Thereafter, the valve 16v is opened so as to supply nitrogen into the interior of reaction vessel 10 through the gap 124. In addition, the valves 16v, 17v are controlled so that the internal pressure of the reaction vessel 10 becomes 50 atm.

Next, the interior of the reaction vessel 10 is heated by the heater 12. At this stage, condition in the reaction vessel 10 is kept 50 atm and 800° C. During this process, nitrogen gas is supplied from the supply pipe 116 into the interior of the reaction vessel 10 at all times.

Next, the rotational shaft 113 is moved vertically downwards so as to submerge the seed crystal 123 in the mixed melt 19 by the rotational driving unit 118. Then the rotational shaft 113 rotates by the rotational driving unit 118 for growing a GaN crystal.

Since nitrogen continues to flow towards the interior of the reaction vessel 10 through the at all times during growth of GaN crystal, no evaporated Na enters the gap. Consequently, a smooth rotation of the seed crystal 123 is implemented. Therefore uniform growth of GaN crystal is attained.

Following above, the rotational shaft 113 is moved vertically upwards by the rotational driving unit 118 so as to pick up the seed crystal 123 from the mixed melt 19. Then, the temperature of the reaction vessel 10 is decreased to the ordinary room temperature, ending the manufacturing of GaN crystal. At this time, as described above, since no evaporated Na enters the gap 124, the vertically upward movement of the rotational shaft 113 is implemented in a smooth fashion, and the resulting GaN crystal can easily be removed from the reaction vessel 10.

As described heretofore, in also the group III nitride semiconductor manufacturing system of Embodiment 2, since evaporated Na is prevented from entering the gap 124 by the continuous flow of nitrogen gas supplied through the gap 124, the smooth rotation of the seed crystal is maintained. This advantage makes it possible to obtain a uniform crystal. In addition, since the manufactured GaN crystal is easily removed from the reaction vessel 10, an operating efficiency is qualified.

Figure 3:
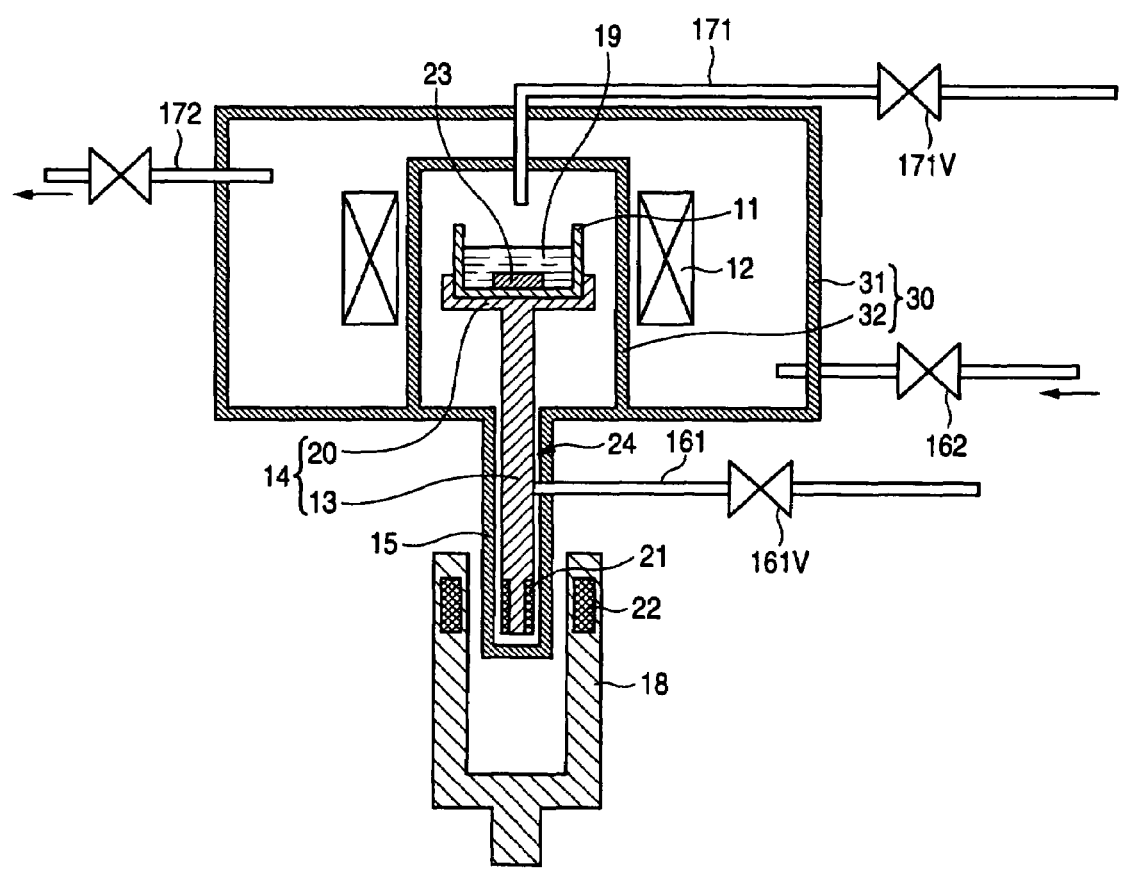
FIG. 3 shows the configuration of a group III nitride semiconductor manufacturing system of Embodiment 3.

FIG. 3 shows the third embodiment. In the following explanation of this embodiment, detail description of the elements same as the first embodiment are omitted. The distinct feature of the third embodiment is the structure of the reaction vessel 30. The reaction vessel 30 has a dual structure including an inner vessel and an outer vessel. As shown in FIG. 3, the outer vessel 31 encloses the inner vessel 32. The inner vessel 32 covers the crucible 11 and the upper part of the holding unit 14. The inner vessel 32 is fixed in the outer vessel 31 at the inner wall of the outer vessel 31 and has a lid (not shown) through which a seed crystal 23, Na, Ga and other source materials are supplied. The opening of the reaction vessel 30 is formed on bottom of the outer vessel 31 shared by the outer vessel 31 and the inner vessel 32. Through the opening, the lower part of the holding unit 14 is extended to the rotational shaft cover 15. In a space between the inner vessel 32 and the outer vessel 31, the heater 12 is mounted. The discharge pipe 171 for the inner vessel 32 is connected to the inner vessel 32 penetrating the outer vessel 31 and the supply pipe 161 for the inner vessel 32 is connected to the rotational shaft cover 24. Additionally, a discharge pipe 172 for the outer vessel 31 is connected to a upper part of the outer vessel and a supply pipe 162 for the outer vessel 31 is connected to a lower part of the outer vessel.

The outer vessel 31 are pressured preferably about 5 MPa by nitrogen gas which is supplied through the supply pipe 162 for the outer vessel 31. This pressure is spread into the inner vessel 32 so as to make nitrogen gas be dissolved into the mixed melt 19. Another way to pressure the inner vessel 32 is to supply nitrogen gas to the inner vessel 32 through the supply pipe 161 for the inner vessel 32. Using the two supply pipes 161 and 162, the inner vessel 32 and the outer vessel 31 are able to be pressured individually. Thus in this configuration, as the outer vessel 31 is responsible for the pressure and the inner vessel 32 is heated by the heater inside of the reaction vessel 30, the efficient crystal growth is performed.

In FIG. 3, though the opening is shared by the inner vessel 31 and the outer vessel 32, configurations are not restricted in the type of FIG. 3. It is possible that the opening is placed only at the outer vessel or inner vessel in other example embodiments.

While in the embodiments Na is used as the flux, alkali metals such as Li and K, alkaline-earth metals such as Mg and Ca or mixtures thereof can also be used. And also, while nitrogen is supplied into the interior of the reaction vessel in the embodiments, a compound such as ammonia which contains nitrogen can be used. Alternatively, an inert gas such as argon can be mixed to the supplied gas.

In addition, while in the embodiments, the supply pipe is provided and connected only to the rotational shaft cover, another one or more supply pipe can be provided which is connected to the reaction vessel.

Additionally, while in the embodiments, only the rotational shaft for rotating the seed crystal or the rotational shaft for rotating the crucible is used, there may be provided a group III nitride semiconductor manufacturing system which has both the shafts. A rotational shaft cover is provided for each of the rotational shafts, and nitrogen is supplied from supply pipes which connect, respectively, to the rotational shaft covers so provided, whereby a uniform group III nitride semiconductor crystal can be manufactured which is similar to those manufactured by the embodiments.

The invention can be applied to the manufacturing of a group III nitride semiconductor based on the Na fluxing method.

What is claimed is:

1. A group III nitride semiconductor manufacturing system, comprising:
   a reacting vessel having an opening;
   a crucible disposed in an interior of the reaction vessel and containing a melt including at least a group III metal and an alkali metal;
   a holding unit supporting the crucible and comprising a rotational shaft extending from the interior of the reaction vessel to an exterior of the reaction vessel through the opening;
   a rotational shaft cover covering a part of the rotational shaft positioned at the exterior of the reacting vessel and being connected to the reacting vessel at the opening;
   a rotational driving unit disposed at an outside of the reacting vessel and regulating the rotational shaft; and
   a supply pipe connected to the rotational shaft cover and supplying a gas including at least nitrogen into a gap between the rotational shaft and the rotational shaft cover,
   wherein the gas and the melt react to grow a group III nitride semiconductor crystal.

2. The group III nitride semiconductor manufacturing system according to claim 1, wherein the rotational shaft comprises a first magnet and the rotational driving unit comprises a second magnet so as to rotate and move the rotational shaft by magnetic coupling between the first magnet and the second magnet.

3. A group III nitride semiconductor manufacturing system comprising:
   a reacting vessel comprising an opening;
   a crucible disposed in an interior of the reaction vessel and containing a melt including at least a group III metal and an alkali metal;
   a holding unit holding a seed crystal and comprising a rotational shaft extending from the interior of the reaction vessel to an exterior to the reaction vessel through the opening;
   a rotational shaft cover covering a part of the rotational shaft positioned at the exterior of the reacting vessel and being connected to the reacting vessel at the opening;
   a rotational driving unit disposed at an outside of the reacting vessel and regulating the rotational shaft; and
   a supply pipe connected to the rotational shaft cover and supplying a gas including at least nitrogen into a gap between the rotational shaft and the rotational shaft cover,
   wherein the gas, the seed crystal, and the melt react to grow a group III nitride semiconductor crystal.

4. The group III nitride semiconductor manufacturing system according to claim 3, wherein the rotational shaft comprises a first magnet and the rotational driving unit comprises a second magnet so as to rotate and move the rotational shaft by magnetic coupling between the first and the second magnet.

5. The group III nitride semiconductor manufacturing system according to claim 1, wherein the reaction vessel comprises a dual structure including an inner vessel and an outer vessel.

6. The group III nitride semiconductor manufacturing system according to claim 5, wherein the inner vessel comprises the opening.

7. The group III nitride semiconductor manufacturing system according to claim 5, wherein the outer vessel comprises the opening.

8. The group III nitride semiconductor manufacturing system according to claim 5, wherein the inner vessel and the outer vessel share the opening.

9. The group III nitride semiconductor manufacturing system according to claim 5, wherein an inside space of the outer vessel is pressured by the gas including the nitrogen.

10. The group III nitride semiconductor manufacturing system according to claim 5, further comprising:
    a heater mounted on an inside of the outer vessel and on an outside of the inner vessel.

11. The group III nitride semiconductor manufacturing system according to claim 7, wherein the rotational shaft cover is connected to the opening of the outer vessel.

12. The group III nitride semiconductor manufacturing system according to claim 8, wherein the rotational shaft cover is connected to the opening at a wall of the outer vessel.

13. The group III nitride semiconductor manufacturing system according to claim 1, wherein the holding unit further comprises a tray on which the crucible is disposed, the rotational shaft being connected to the tray.

14. The group III nitride semiconductor manufacturing system according to claim 1, wherein the crucible comprises boron nitride.

15. The group III nitride semiconductor manufacturing system according to claim 1, wherein the rotational shaft cover separates the interior of the reaction vessel from the exterior of the reaction vessel such that said gap forms a continuous space between the rotational shaft, the rotational shaft cover, and the interior of the reaction vessel.

16. The group III nitride semiconductor manufacturing system according to claim 1, further comprising a magnet provided on an external side portion of the rotational shaft cover to move up and down the rotational shaft in a vertical direction.

17. The group III nitride semiconductor manufacturing system according to claim 1, wherein the rotational shaft cover seals the interior of the reaction vessel and the exterior of the reaction vessel.

18. The group III nitride semiconductor manufacturing system according to claim 1, wherein the rotational driving unit rotates the rotational shaft to stir the melt in the crucible.

19. The group III nitride semiconductor manufacturing system according to claim 3, wherein the holding unit further comprises a tray on which the crucible is disposed, and
    wherein a magnet provided on an external side portion of the rotational shaft cover moves up and down the rotational shaft and the tray in a vertical direction.

20. The group III nitride semiconductor manufacturing system according to claim 3, wherein the rotational shaft cover separates the interior of the reaction vessel from the exterior of the reaction vessel such that said gap forms a continuous space between the rotational shaft, the rotational shaft cover, and the interior of the reaction vessel, and
    wherein the rotational shaft cover seals the interior of the reaction vessel and the exterior of the reaction vessel.

* * * * *